(12) United States Patent
Chang et al.

(10) Patent No.: US 6,919,245 B2
(45) Date of Patent: Jul. 19, 2005

(54) DYNAMIC RANDOM ACCESS MEMORY CELL LAYOUT AND FABRICATION METHOD THEREOF

(75) Inventors: Ming-Cheng Chang, Taoyuan Hsien (TW); Tieh-Chiang Wu, Ilan (TW); Yi-Nan Chen, Taipei (TW); Jeng-Ping Lin, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/972,505

(22) Filed: Oct. 25, 2004

(65) Prior Publication Data

US 2005/0082590 A1 Apr. 21, 2005

Related U.S. Application Data

(62) Division of application No. 10/761,985, filed on Jan. 21, 2004.

(30) Foreign Application Priority Data

Sep. 2, 2003 (TW) .......................................... 92124187 A

(51) Int. Cl.$^7$ .......................................... H01L 21/8242
(52) U.S. Cl. ...................... 438/242; 438/243; 438/248; 438/249; 438/386
(58) Field of Search ................................. 438/242, 243, 438/248, 249, 386

(56) References Cited

U.S. PATENT DOCUMENTS 6,399,447 B1 * 6/2002 Clevenger et al. .......... 438/268

\* cited by examiner

*Primary Examiner*—Thien F Tran
(74) *Attorney, Agent, or Firm*—Quintero Law Office

(57) ABSTRACT

A dynamic random access memory (DRAM) cell layout for arranging deep trenches and active areas and a fabrication method thereof. An active area comprises two vertical transistors, a common bitline contact and two deep trenches. The first vertical transistor is formed on a region where the first deep trench is partially overlapped with the first gate conductive line. The second vertical transistor is formed on a region where the second deep trench is partially overlapped with the second gate conductive line.

9 Claims, 18 Drawing Sheets

DYNAMIC RANDOM ACCESS MEMORY CELL LAYOUT AND FABRICATION METHOD THEREOF

This application is a divisional of U.S. application Ser. No. 10/761,985, filed Jan. 21, 2004.

BACKGROUND OF THE INVENTION

1. Field of the Invention

The invention relates to a memory cell of a semiconductor device, and more particularly to a dynamic random access memory (DRAM) cell layout for arranging deep trenches and active areas and a fabrication method thereof.

2. Description of the Related Art

A dynamic random access memory (DRAM) cell typically includes a memory cell coupled to a storage capacitor. Generally the storage capacitor is formed within a deep trench etched into a semiconductor substrate. The storage capacitor is accessed using an access transistor which allows charge to be stored in the storage capacitor or retrieves charge from the storage capacitor depending on whether the desired action is a read or write function. For a buried strap type trench capacitor, dopant outdiffusion near a wordline can cause a short channel effect in the access transistor channel, thus reducing subthreshold conduction and causing a fail in retention time.

FIG. 1 is a conventional DRAM cell layout. Deep trench capacitors 10 are disposed under passing wordlines 12. Access transistors 14 are electrically coupled to storage nodes 16 of the trench capacitors 10 through diffusion regions 18 which may be either a source or a drain of the access transistors 14. Diffusion regions 20 are electrically connected to bitline contacts 22 which connect to bitlines (not shown) to read and write to the storage nodes 16 through the access transistors 14. Access transistors 14 are activated by the wordlines 12. When voltage is applied to the wordlines 12, a channel below the wordline 12 conducts and allows current to flow between diffusion regions 18 and 20 and into or out of the storage node 16. Wordlines 12 are preferably spaced across the smallest possible distance to conserve the layout area. The smallest possible distance is typically a minimum feature size "F".

FIG. 2 is a cross-section along line 2—2 of FIG. 1. Elements of FIG. 2 are labeled as described in FIG. 1. The storage nodes 16 are isolated from a doped well 24 by a dielectric collar 26. A shallow trench isolation (STI) 28 is provided over the storage nodes 16 to electrically isolate the passing wordlines 12 formed above storage nodes 16. The diffusion region 18 of the access transistor 14 is connected to the storage node 16 through a buried strap (BS) 32 and a BS out-diffusion region 30. Considering an overlay tolerance effect, a BS merge phenomenon easily occurs to cause a short channel effect in a channel region 34 underlying a gate electrode 36 of the access transistor 14.

SUMMARY OF THE INVENTION

Accordingly, an object of the present invention is to provide a DRAM cell layout and a fabrication method thereof to improve subthreshold conduction and retention time performance.

According to the object of the invention, a dynamic random access memory cell layout has a first gate conductor pair and a second gate conductor pair extending along a first direction, in which each gate conductor pair comprises a first gate conductive line and a second gate conductive line. A bitline pair has a first bitline and a second bitline, which extend along a second direction and intersect the gate conductor pairs. Corresponding to the first bitline, a first active area extends along the second direction to cross the first gate conductor pair. Corresponding to the second bitline, a second active area extends along the second direction to cross the second gate conductor pair. Each active area has a first deep trench and a second deep trench formed in a substrate underneath the first gate conductive line and the second gate conductive line, respectively. A bitline contact is formed between the first gate conductive line and the second gate conductive line to be electrically connected to the corresponding bitline. A common source/drain region is formed in the substrate between the first gate conductive line and the second gate conductive line to be electrically connected to the bitline contact. A first vertical transistor and a second vertical transistor are formed overlying the first deep trench and the second deep trench, respectively. Each vertical transistor has a buried strap out-diffusion region formed in the substrate adjacent to one sidewall of the deep trench.

DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

First Embodiment

Figure 1:
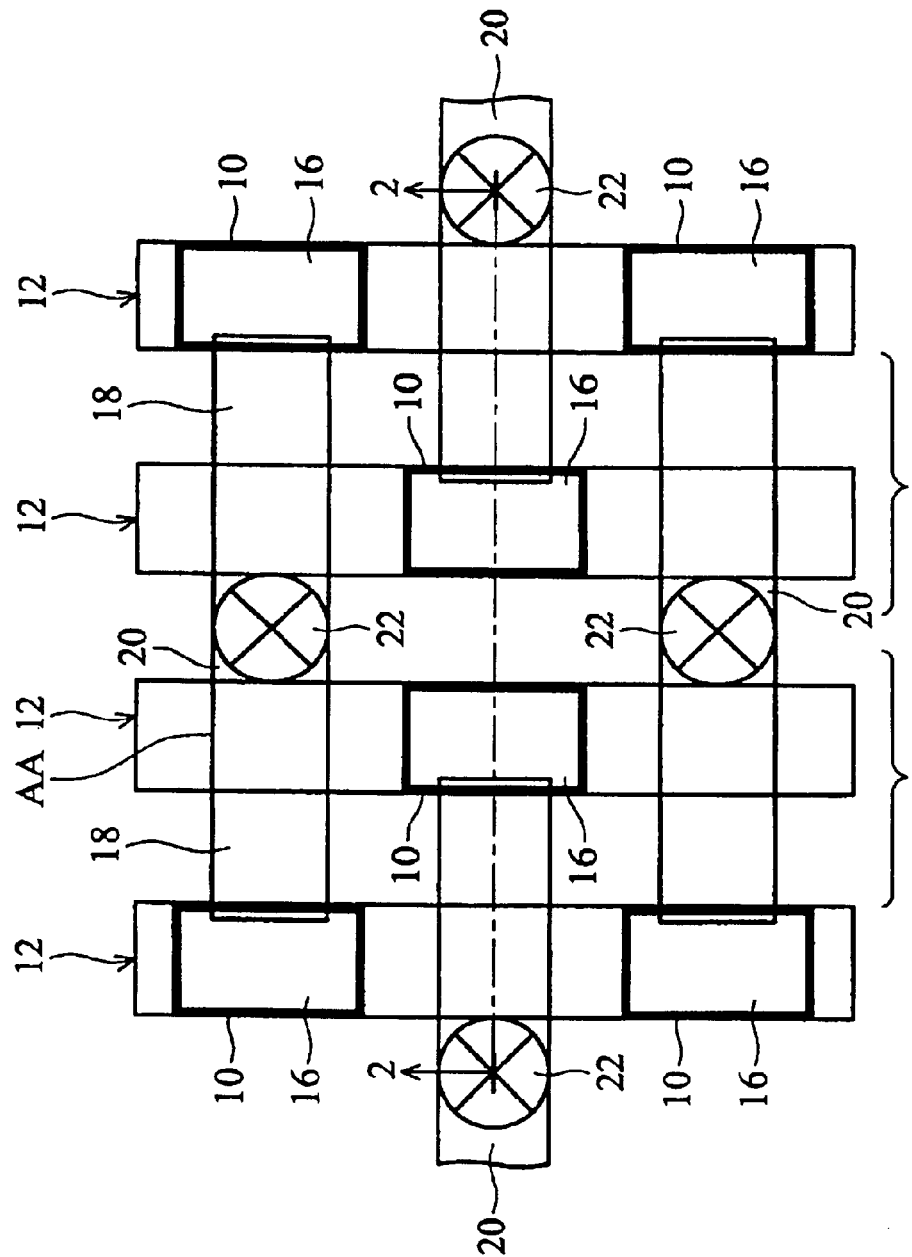
FIG. 1 is a conventional DRAM cell layout.
Figure 2:
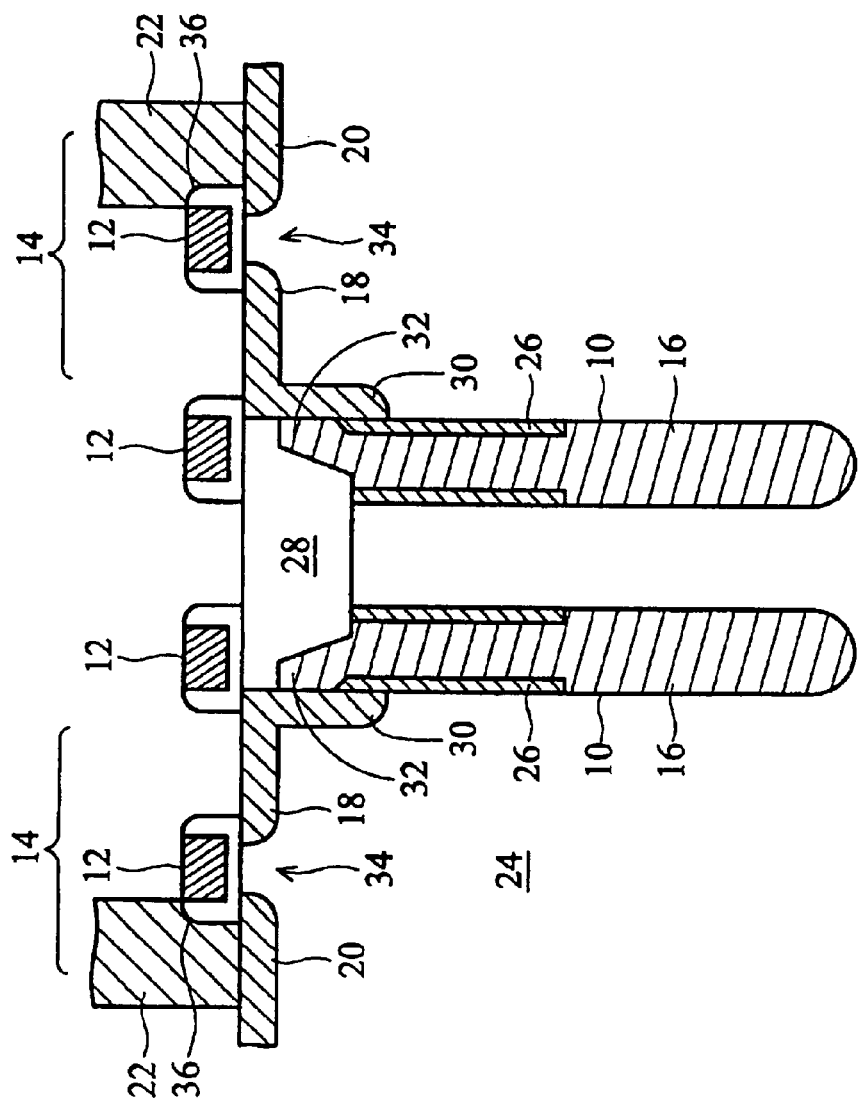
FIG. 2 is a cross-section along line 2—2 of FIG. 1.
Figure 3:
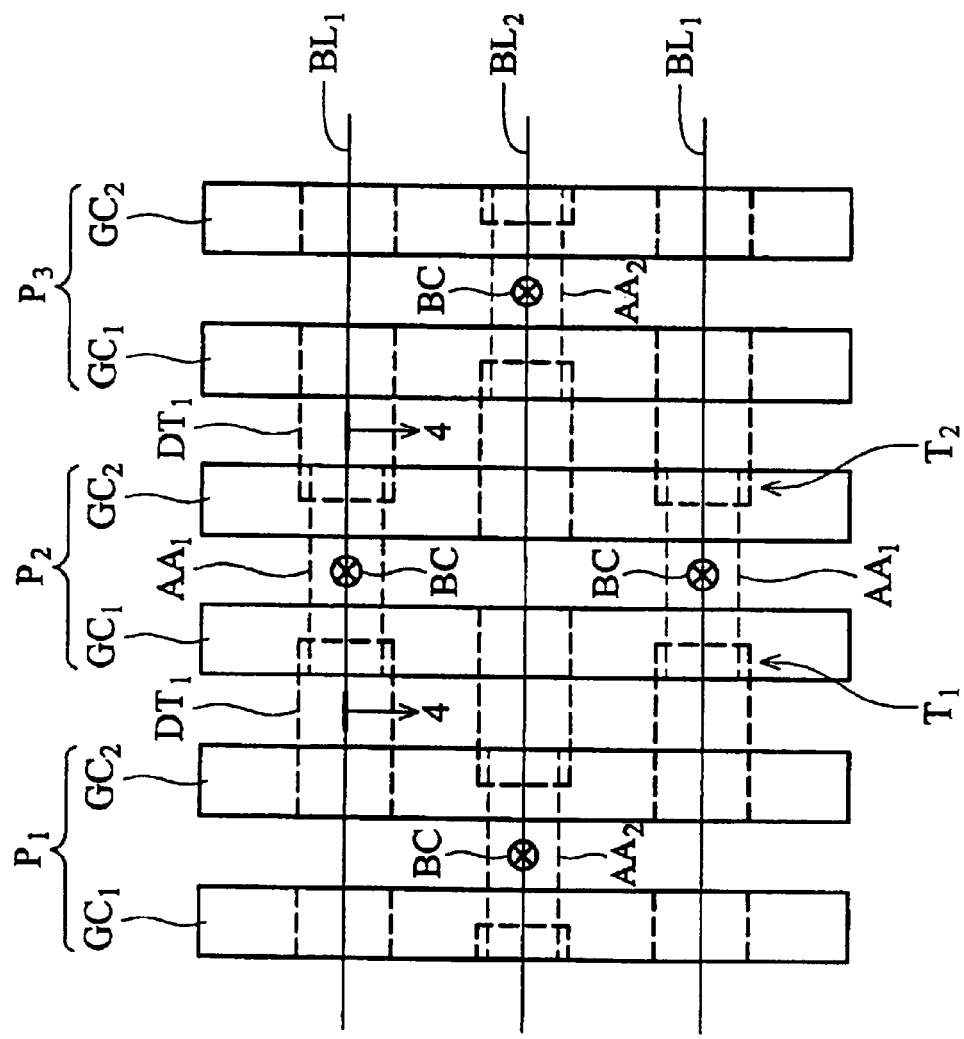
FIG. 3 is a DRAM cell layout of deep trenches and active areas according to the first embodiment of the present invention.

FIG. 3 is a DRAM cell layout of deep trenches and active areas according to the first embodiment of the present invention. The DRAM cell layout comprises a plurality of gate conductor pairs $P_1$, $P_2$ and $P_3$ and a plurality of bitlines $BL_1$ and $BL_2$. Each of the gate conductor pairs $P_1$, $P_2$ and $P_3$ comprises a first gate conductive line $GC_1$ and a second gate conductive line $GC_2$ arranged parallel to each other. The gate conductive lines $GC_1$ and $GC_2$ extending along a first direction and the bitlines $BL_1$ and $BL_2$ extending along a second direction intersect to define a plurality of DRAM cells. A first active area $AA_1$ is defined at the intersection of the second gate conductor pair $P_2$ and the first bitline $BL_1$. A second active area $AA_2$ is defined at the intersection of the first gate conductor pair $P_1$ and the second bitline $BL_2$, alternatively, at the intersection of the third gate conductor pair $P_3$ and the second bitline $BL_2$.

The first active area $AA_1$ extends along the first bitline $BL_1$ to cross the first gate conductive line $GC_1$ and a second gate conductive line $GC_2$ of the second gate conductor pair $P_2$, and comprises two vertical transistors $T_1$ and $T_2$, a common bitline contact BC and two deep trenches $DT_1$ and $DT_2$. The first vertical transistor $T_1$ is formed on a region where the first deep trench $DT_1$ is partially overlapped with the first gate conductive line $GC_1$. The second vertical transistor $T_2$ is formed on a region where the second deep trench $DT_2$ is partially overlapped with the second gate conductive line $GC_2$.

The second active area $AA_2$ extends along the second bitline $BL_2$ to cross the first gate conductive line $GC_1$ and a second gate conductive line $GC_2$ of the first gate conductor pair $P_1$. Alternatively, the second active area $AA_2$ crosses the first gate conductive line $GC_1$ and a second gate conductive line $GC_2$ of the third gate conductor pair $P_3$. The second active area $AA_2$ comprises two vertical transistors $T_1$ and $T_2$, a common bitline contact BC and two deep trenches $DT_1$ and $DT_2$. The first vertical transistor $T_1$ is formed on a region where the first deep trench $DT_1$ is partially overlapped with the first gate conductive line $GC_1$. The second vertical transistor $T_2$ is formed on a region where the second deep trench $DT_2$ is partially overlapped with the second gate conductive line $GC_2$.

Figure 4:
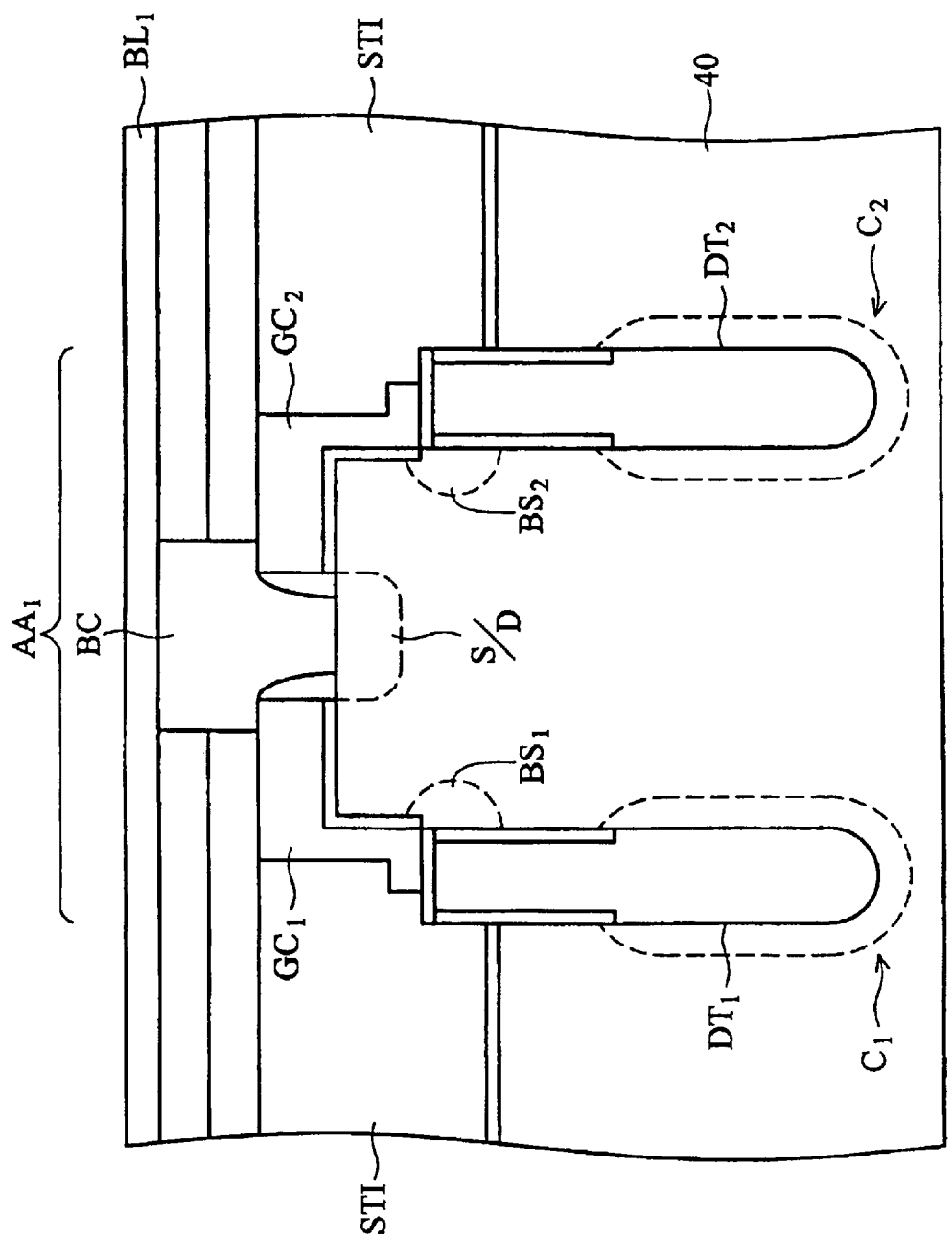
FIG. 4 is a cross-section along line 4—4 of FIG. 3.

FIG. 4 is a cross-section along line 4—4 of FIG. 3. For the first active area $AA_1$, the first deep trench $DT_1$ and the second deep trench $DT_2$ are formed by etching a semiconductor silicon substrate 40, and a shallow trench isolation structure STI is formed outside the first deep trench $DT_1$ and the second deep trench $DT_2$ for isolating the first active area $AA_1$ from the second active area $AA_2$. A first deep trench capacitor $C_1$ and a second deep trench capacitor $C_2$ are formed at the lower portions of the first deep trench DTI and the second deep trench $DT_2$, respectively. A first buried strap out-diffusion region BS, is formed in the substrate 40 adjacent to one sidewall of the middle portion of the first deep trench $D_1$. The first buried strap out-diffusion region $BS_1$ serves as a source/drain region of the first vertical transistor $T_1$, and provides an electrical connection between the first vertical transistor $T_1$ and the first deep trench capacitor $C_1$. Similarly, a second buried strap out-diffusion region $BS_2$ is formed in the substrate 40 adjacent to one sidewall of the middle portion of the second deep trench $D_2$. The second buried strap out-diffusion region $BS_2$ serves as a source/drain region of the second vertical transistor $T_2$, and provides an electrical connection between the second vertical transistor $T_2$ and the second deep trench capacitor $C_2$. The first gate conductive line $GC_1$ partially overlaps the upper portion of first deep trench $DT_1$ to serve as a gate electrode of the first vertical transistor $T_1$. The second gate conductive line $GC_2$ partially overlaps the upper portion of second deep trench $DT_2$ to serve as a gate electrode of the second vertical transistor $T_2$. A common source/drain region S/D is formed in the substrate 40 between the first gate conductive line $GC_1$ and the second gate conductive line $GC_2$. Thus, a first vertical channel region is provided between the common source/drain region S/D and the first buried strap out-diffusion region $BS_1$, and a second vertical channel region is provided between the common source/drain region S/D and the second buried strap out-diffusion region $BS_2$. The bitline contact BC is formed overlying the common source/drain region S/D and electrically connected to the first bitline $BL_1$. Accordingly, the DRAM cell layout of the vertical transistors $T_1$ and $T_2$ and the deep trenches $DT_1$ and $DT_2$ can prevent deterioration of subthreshold conduction, thus improving retention time performance.

Second Embodiment

Figure 5:
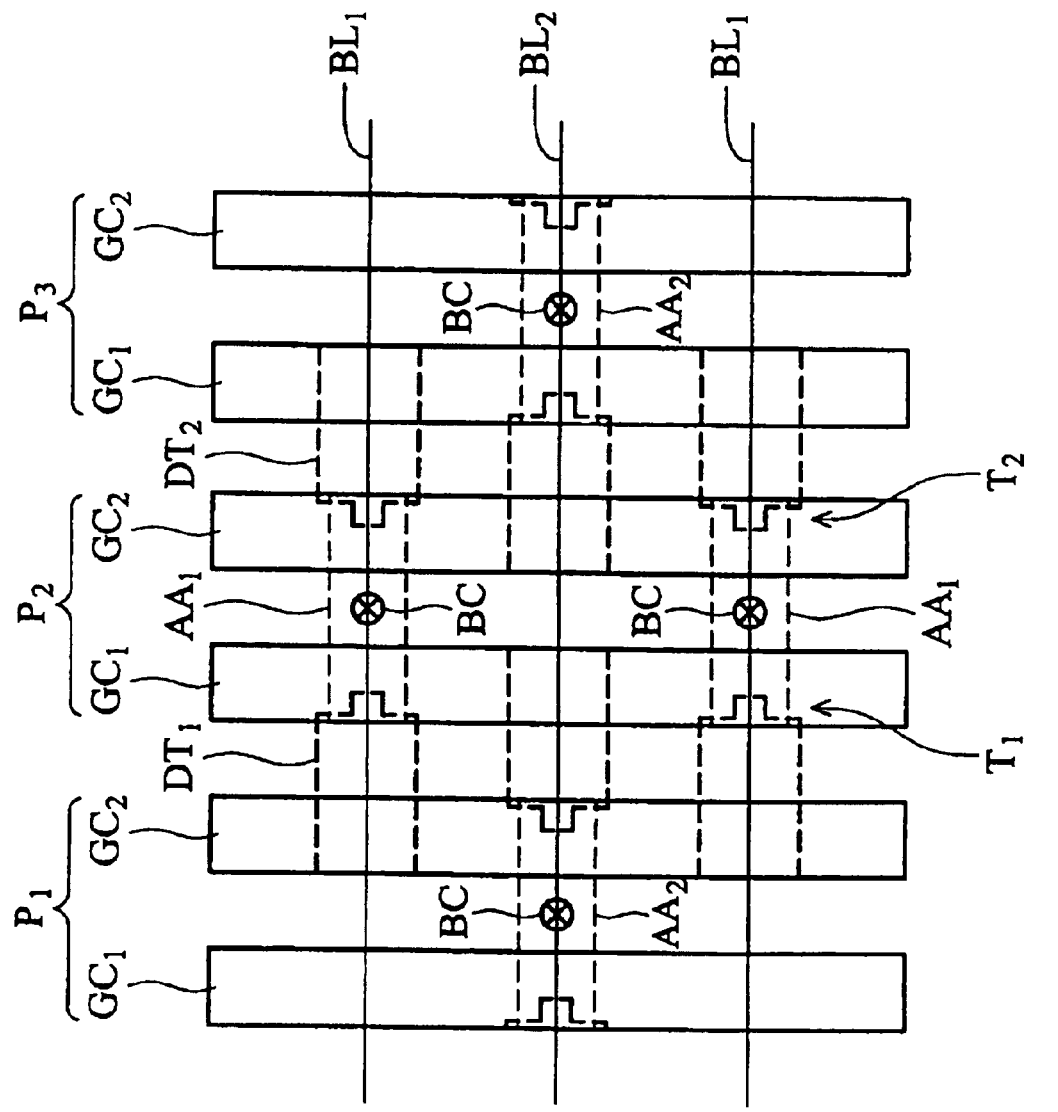
FIG. 5 is a DRAM cell layout of deep trenches and active areas according to the second embodiment of the present invention.
Figure 6:
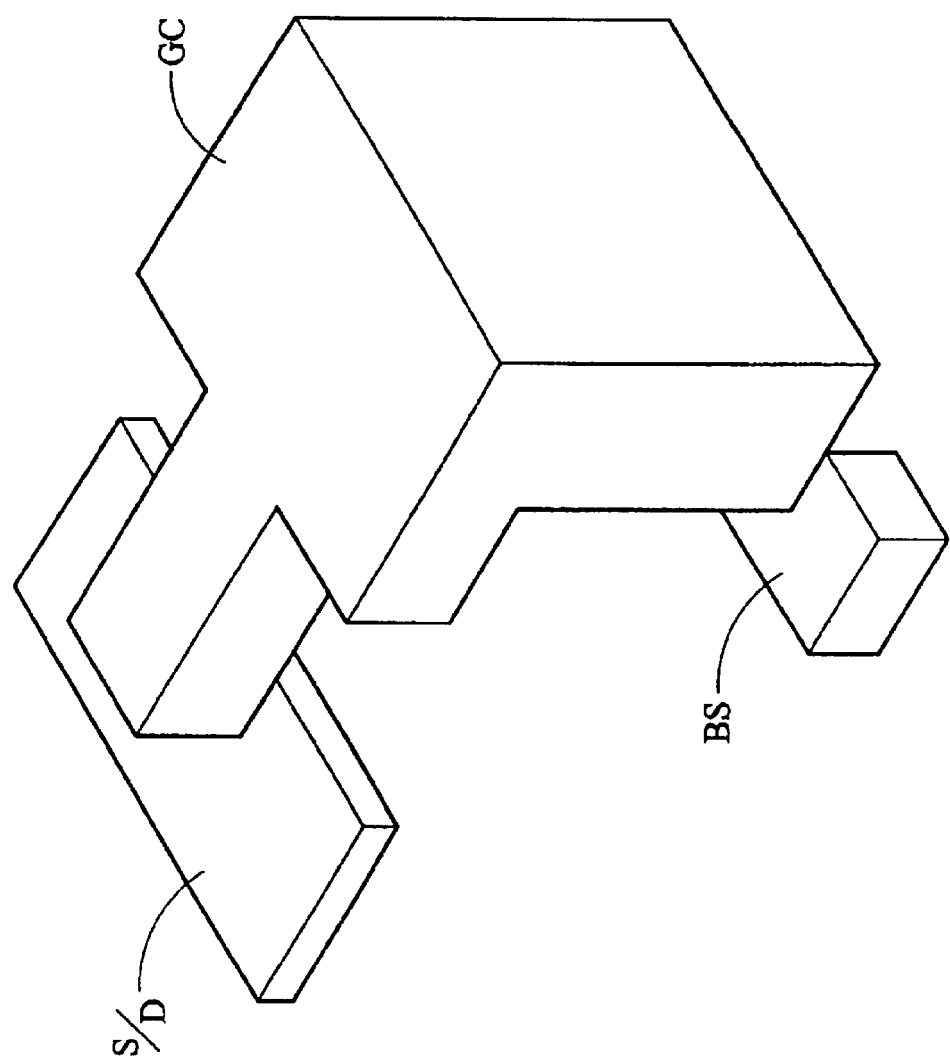
FIG. 6 is a three-dimensional diagram of a vertical transistor according to the second embodiment of the present invention.

FIG. 5 is a DRAM cell layout of deep trenches and active areas according to the second embodiment of the present invention. FIG. 6 is a three-dimensional diagram of a vertical transistor according to the second embodiment of the present invention. Elements similar to those shown in FIGS. 3 and 4 are omitted here.

The DRAM cell layout of deep trenches and active areas of the second embodiment is substantially similar to that of the first embodiment, with the similar portions omitted herein. The different portion is the profile of the overlapping region between the deep trench and the vertical transistor. In the first embodiment, on the overlapping region between the deep trench and the vertical transistor, the sidewall profile of the deep trench is a line. Comparatively, in the second embodiment, on the overlapping region between the deep trench and the vertical transistor, the sidewall profile of the deep trench comprises at least three edges. For example, a five-edge sidewall profile, such as a ⊓-shaped sidewall.

Preferably, on an active area AA, the first deep trench $DT_1$ is partially overlapped with the first gate conductive line $GC_1$, and the first deep trench $DT_1$ comprises a ⊓-shaped sidewall within the overlapping portion therebetween. Similarly, the second deep trench $DT_2$ is partially overlapped with the second gate conductive line $GC_2$, and the second deep trench $DT_2$ comprises a ⊓-shaped sidewall within the overlapping portion therebetween. Therefore, the vertical channel region between the common source/drain region S/D and the buried strap out-diffusion region BS becomes a multilateral structure, viewed as a three-dimensional design, which can further improve subthreshold conduction and retention time performance.

Third Embodiment

FIGS. 7A–7L are cross-sections of a fabrication method for above-described deep trenches and vertical transistors.

Figure 7A:
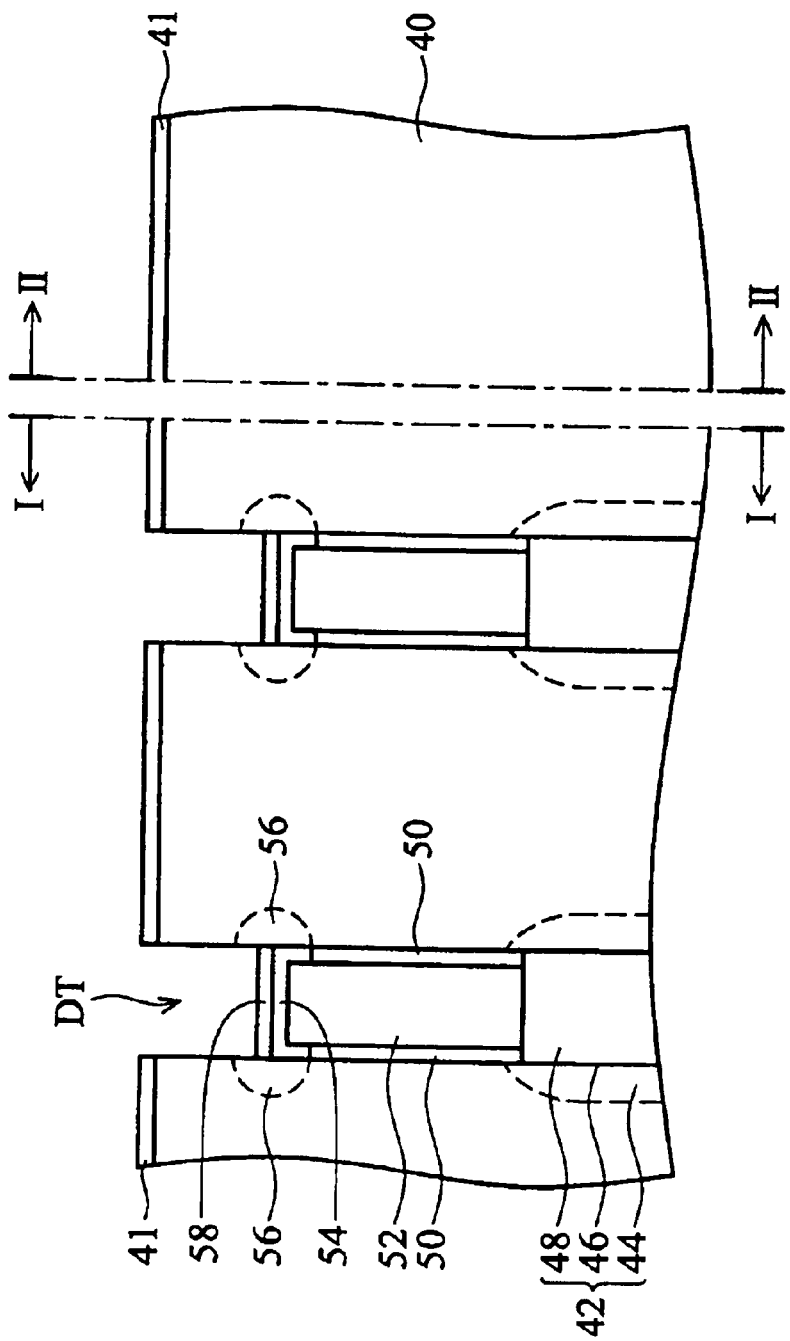
FIGS. 7A–7L are cross-sections of a fabrication method for above-described deep trenches and vertical transistors.

In FIG. 7A, an array area I and a support area II are defined on a semiconductor silicon substrate 40. A p-type semiconductor silicon substrate 40 is described below for example. First, a pad layer 41 and a reactive ion etching (RIE) method are employed to pattern a deep trench DT in the substrate 40 within the array area I. Then, a deep trench capacitor 42 including a bottom electrode plate 44, a capacitor dielectric 46 and an upper electrode plate 48 is fabricated at the lower portion of the deep trench DT. Preferably, the bottom electrode plate 44 is an $n^+$-type diffusion region, the capacitor dielectric 46 is an ONO (oxide-nitride-oxide) stack structure, and the upper electrode plate 48 is a first polysilicon layer with $n^+$-type dopants. Next, in a collar dielectric process, a collar dielectric layer 50 is formed on the sidewall of the deep trench DT. Next, a second polysilicon layer 52 with $n^+$-type dopants and a third polysilicon layer 54 are formed in the deep trench DT. Next, a thermal diffusion process is employed to make the $n^+$-type dopants diffuse through the third polysilicon layer 54 into the substrate 40, resulting in a buried strap out-diffusion region 56 in the substrate 40 adjacent to the third polysilicon layer 54. Next, deposition and etching are used to form a top isolating layer 58 on the third polysilicon layer 54.

Figure 7B:
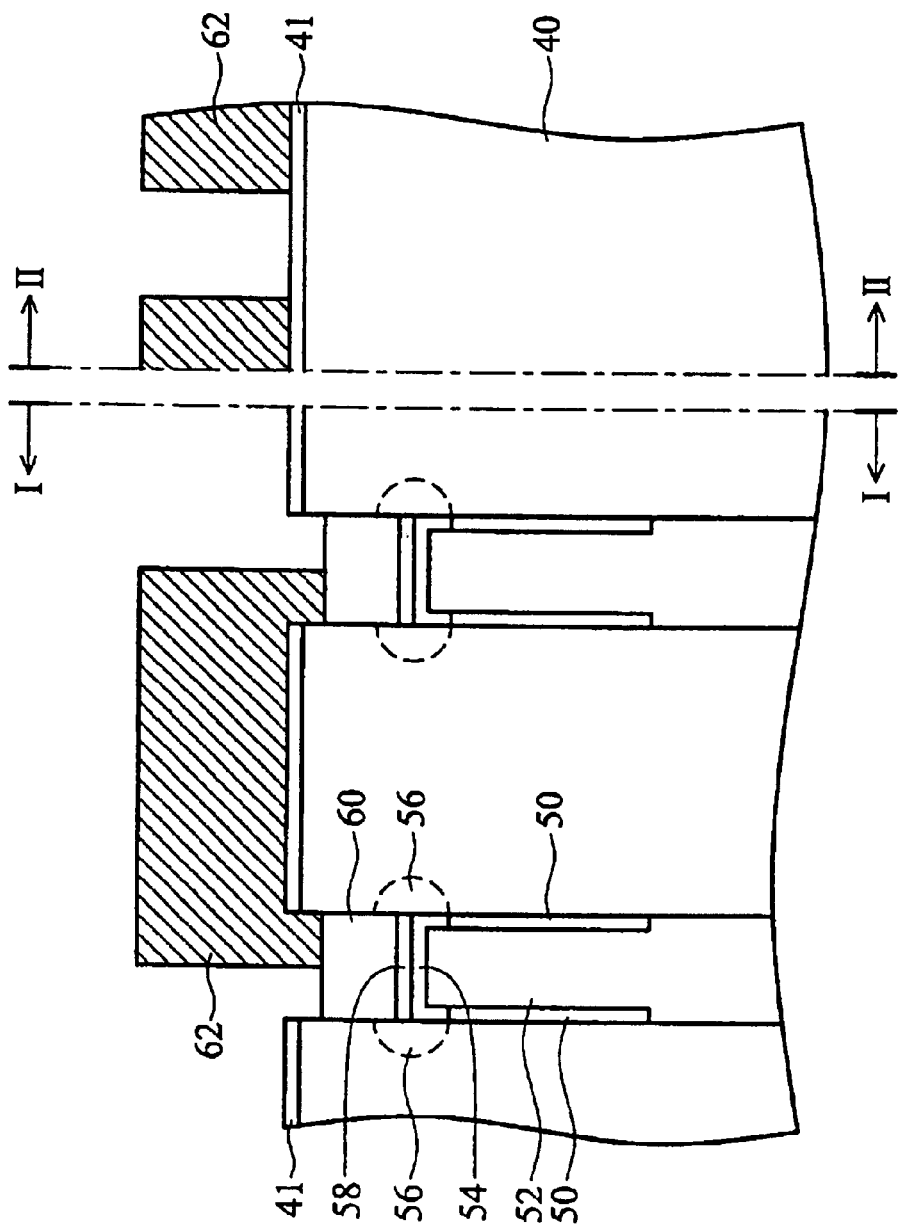
Figure 7C:
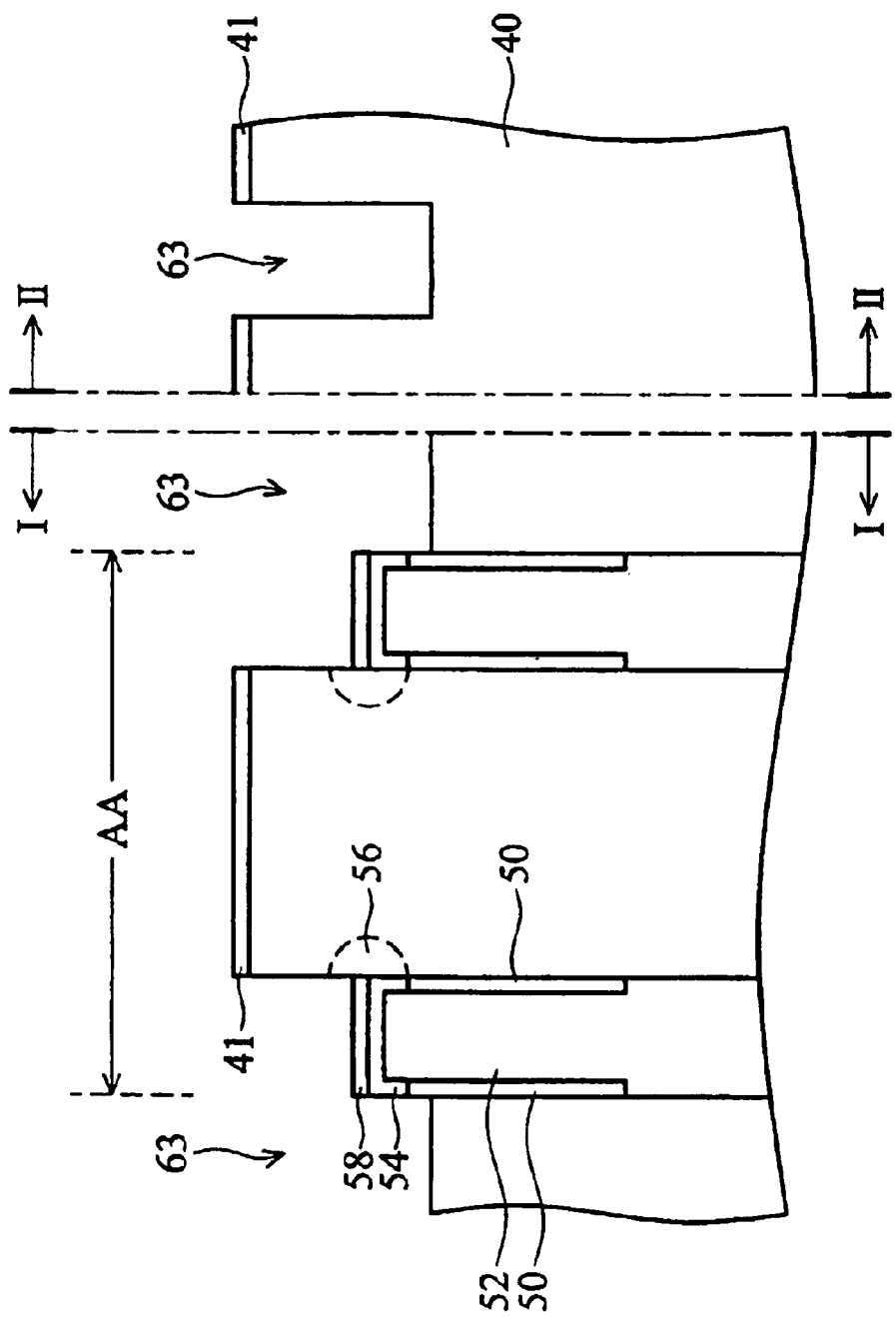

In FIG. 7B, an anti-reflective coating (ARC) layer 60 is formed in the deep trench DT, and a first photoresist layer 62 is patterned on the substrate 40 for defining shallow trench isolations in the array area I and the support area II. Next, using the first photoresist layer 62 as a mask, the exposed portions of the pad layer 41 and the semiconductor silicon substrate 40 are removed to form shallow trenches 63, as shown in FIG. 7C, thus defining an active area AA within the array area I. Then, the ARC layer 60 and the first photoresist layer 62 are removed.

Figure 7D:
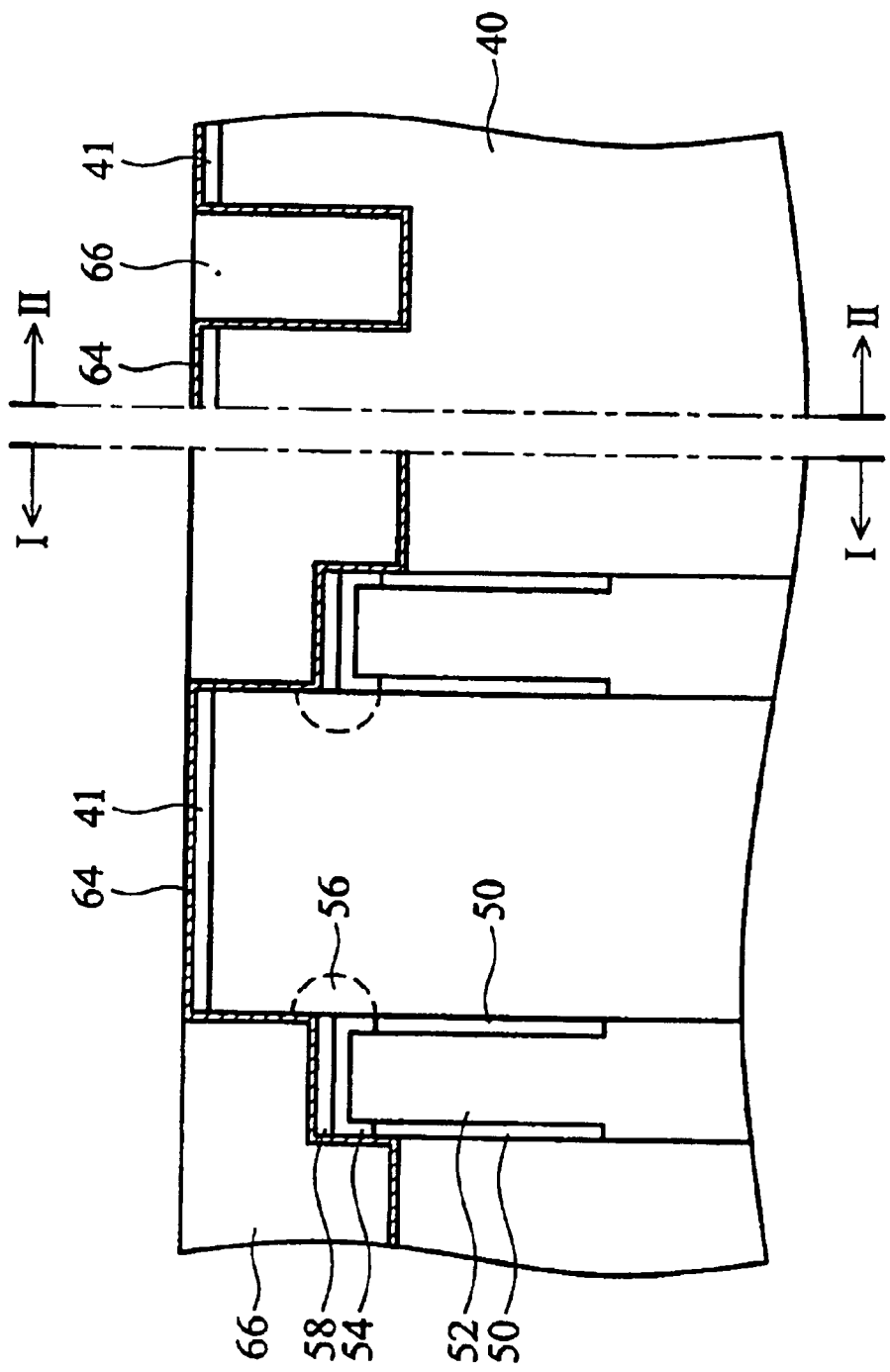
Figure 7E:
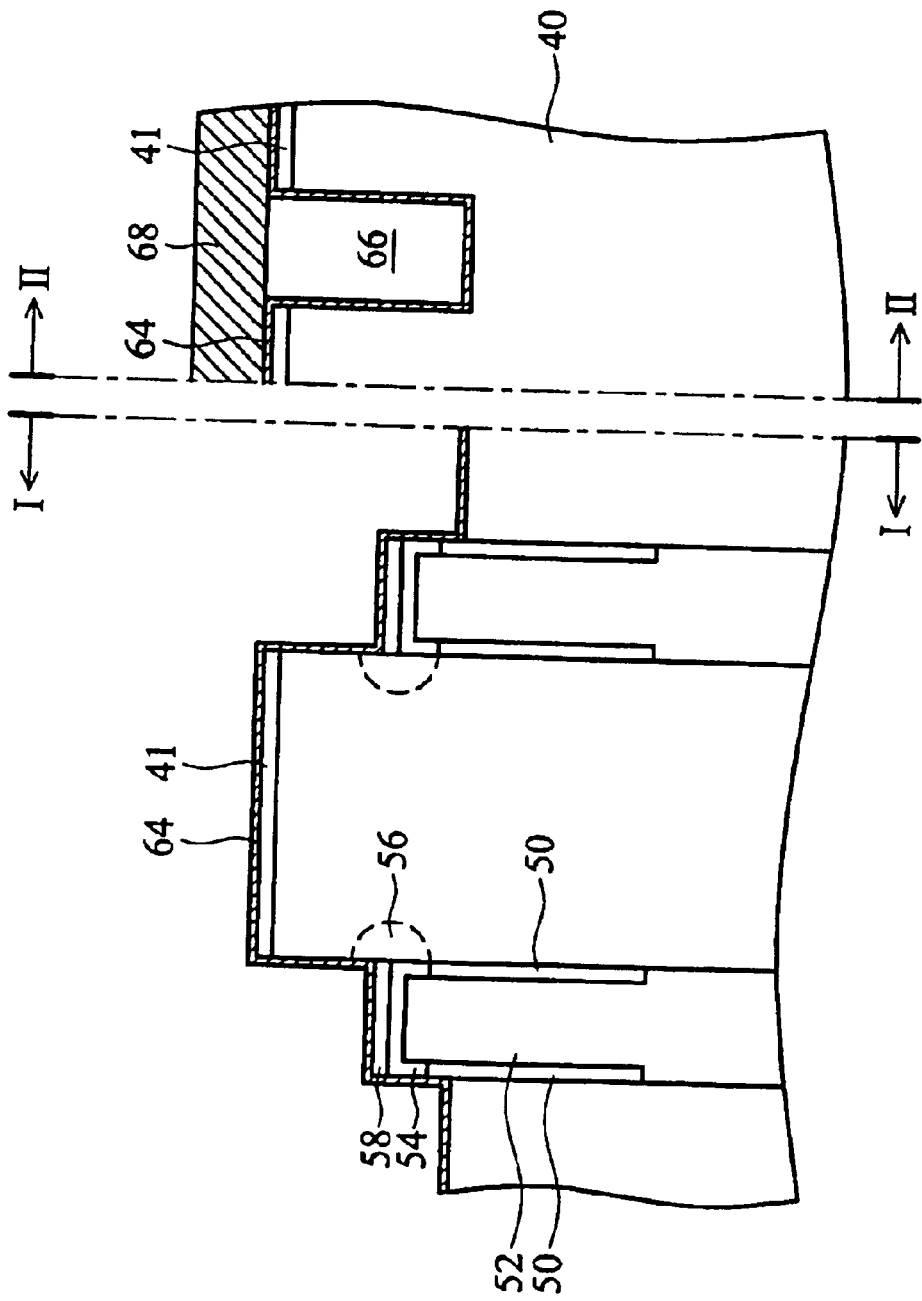
Figure 7F:
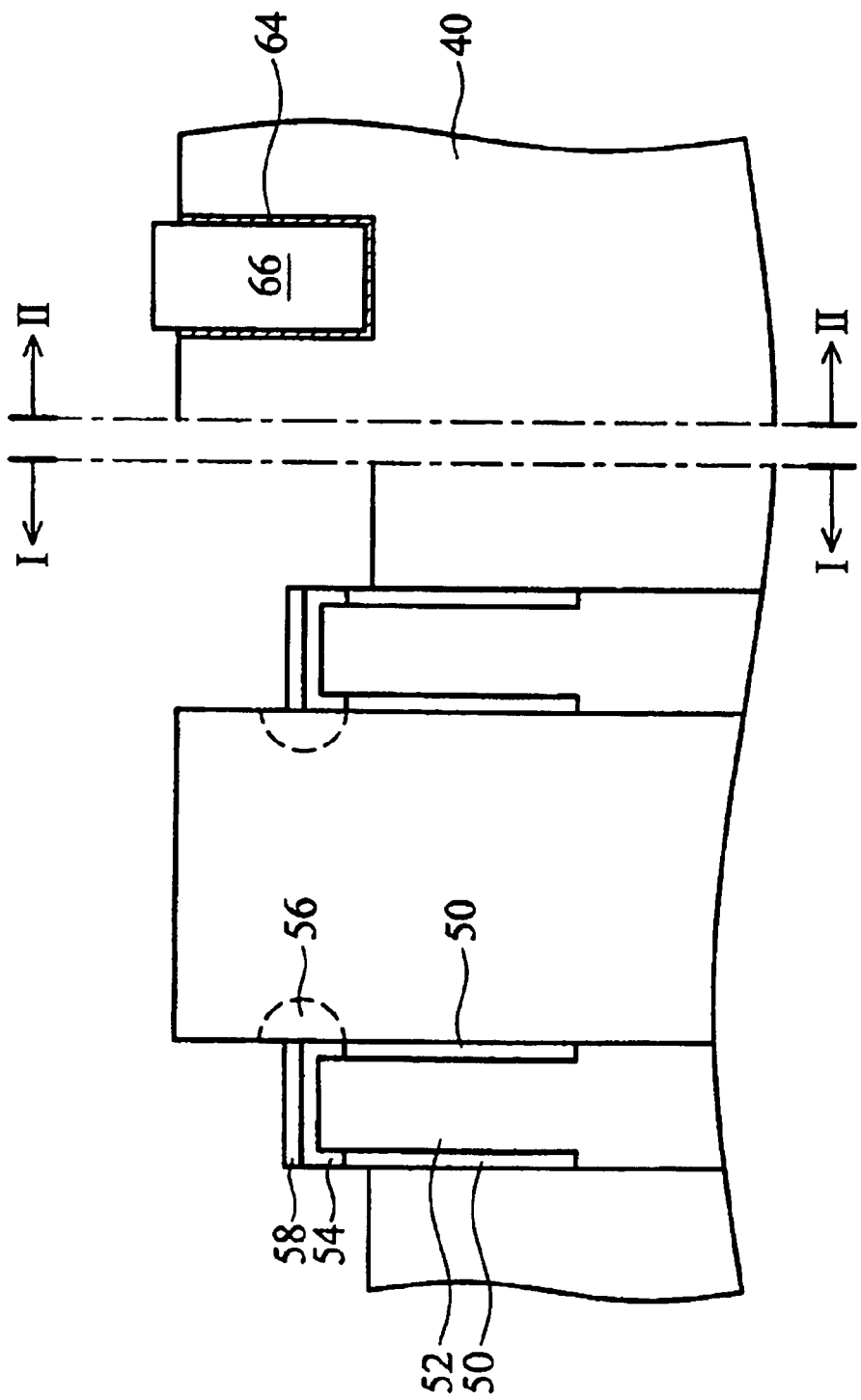

In FIG. 7D, a nitride liner 64 is conformally deposited on the substrate 40, and then a first HDP (high density plasma) oxide layer 66 is formed to fill the shallow trenches 63. Next, chemical mechanical polishing (CMP) is used to level off the top surfaces of the first HDP oxide layer 66 and the nitride liner 64. Next, in FIG. 7E, a second photoresist layer 68 is provided to cover the support area II. Next, using the nitride liner 64 as an etching stop layer, the first HDP oxide layer 66 within the array area I is removed. Then, the second photoresist layer 68 is removed. In FIG. 7F, after removing the nitride liner 64 and the pad layer 41, a sacrificial oxide layer is formed so as to perform an ion implantation process on the array area I and the support area II for adjusting device threshold voltage.

Figure 7G:
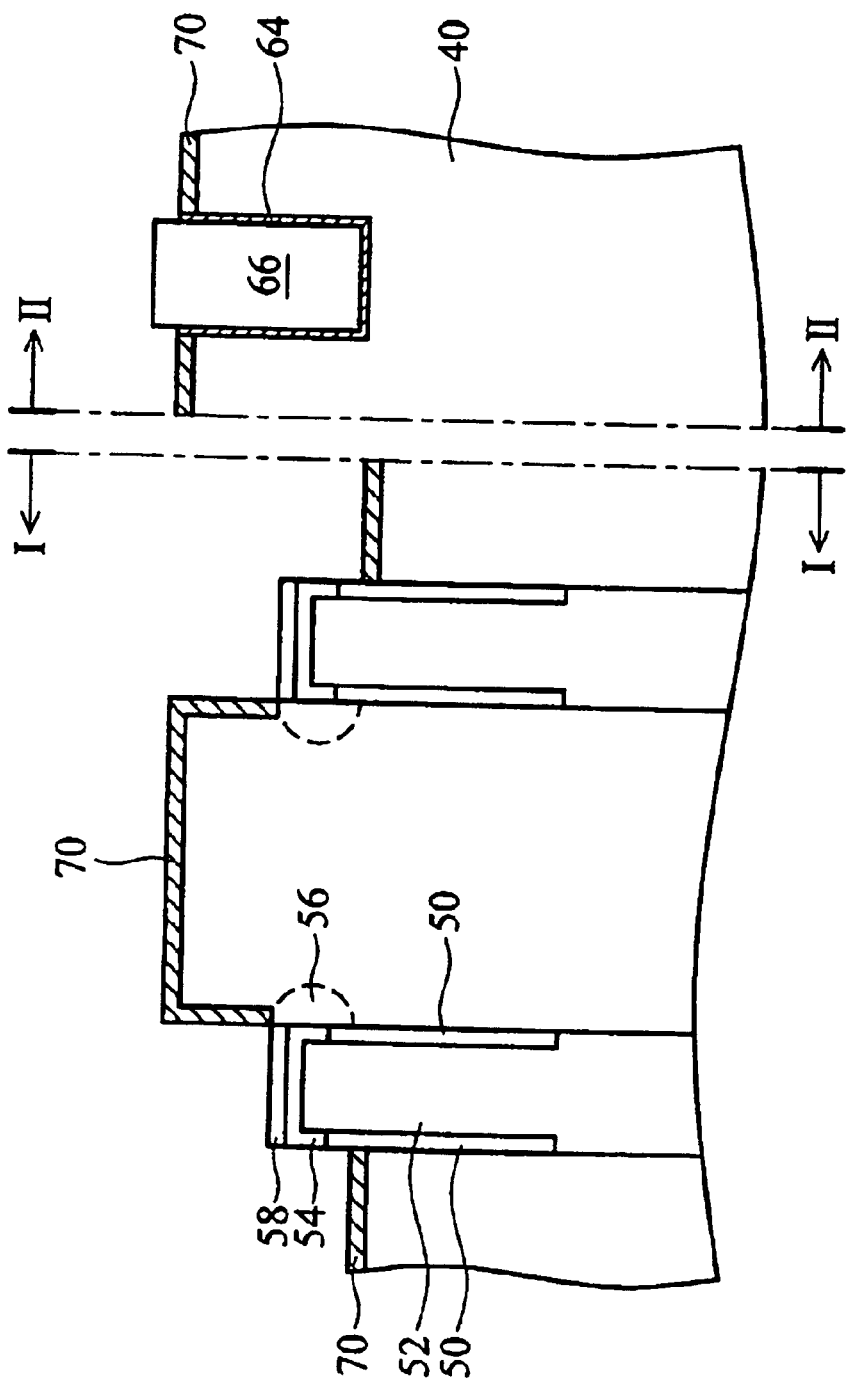
Figure 7H:
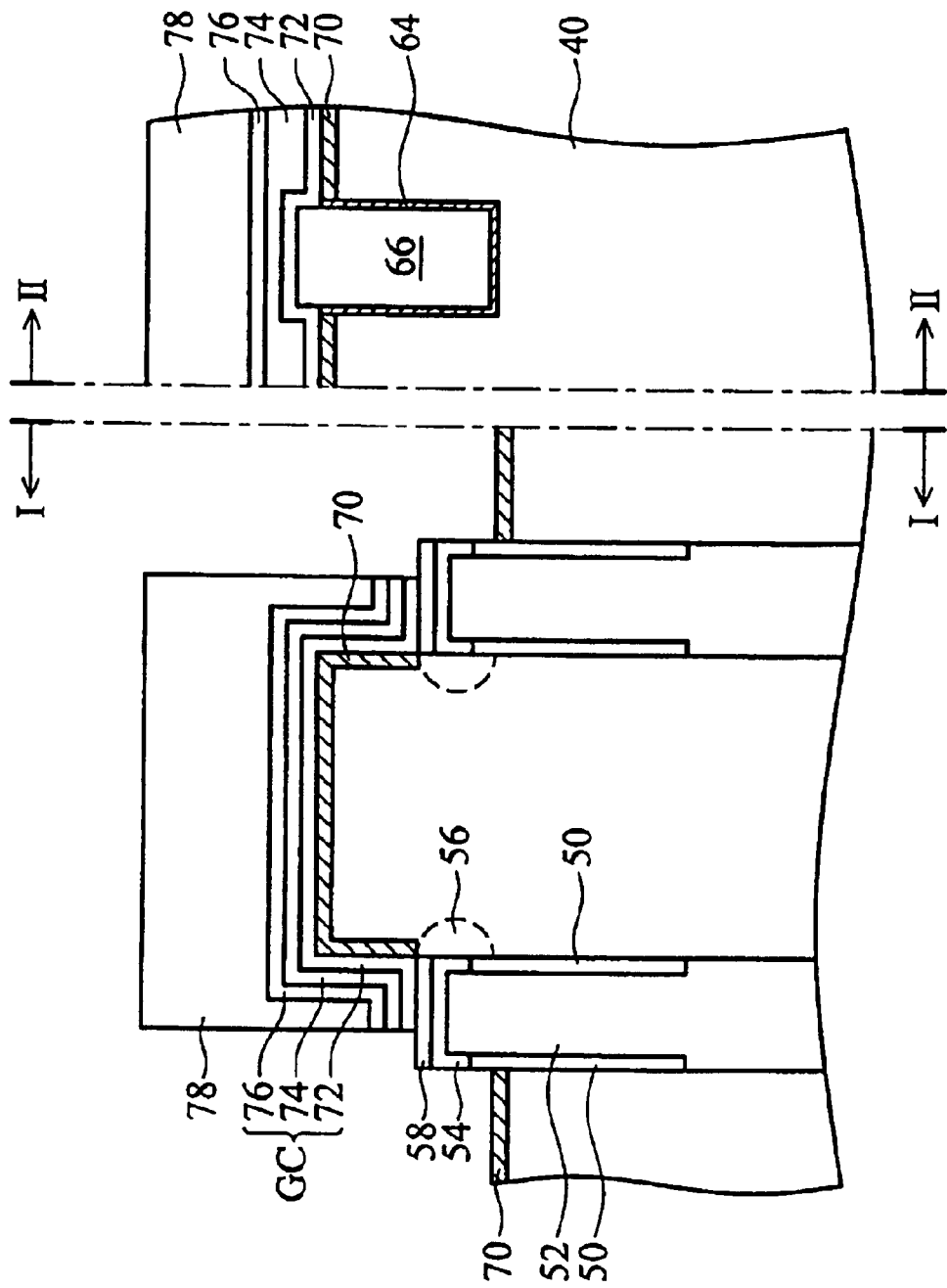

In FIG. 7G, after removing the sacrificial oxide layer, a thermal oxidation process is employed to grow a gate oxide layer 70 on the exposed silicon surface of the substrate 40. Next, in FIG. 7H, a gate polysilicon layer 72, a metallic silicide layer 74 (such as a WSi layer) and a nitride cap layer 76 are successively deposited on the substrate 40. Then, using a third photoresist layer 78 as a mask to perform an etching process, the gate polysilicon layer 72, the metallic silicide layer 74 and the nitride cap layer 76 within the array area I are patterned as a gate conductive line GC, which partially overlaps two tops of two adjacent deep trenches DT.

Figure 7I:
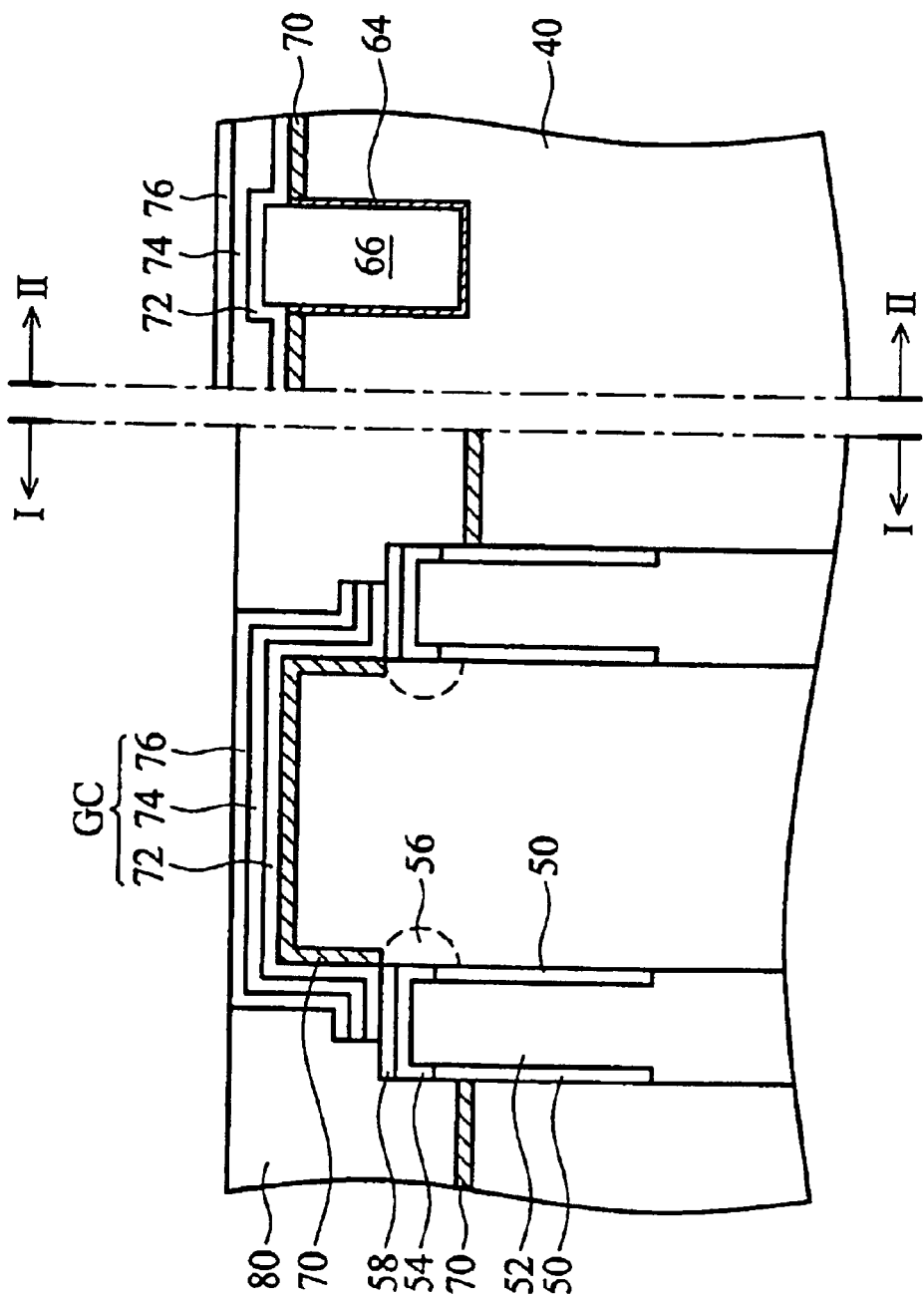
Figure 7J:
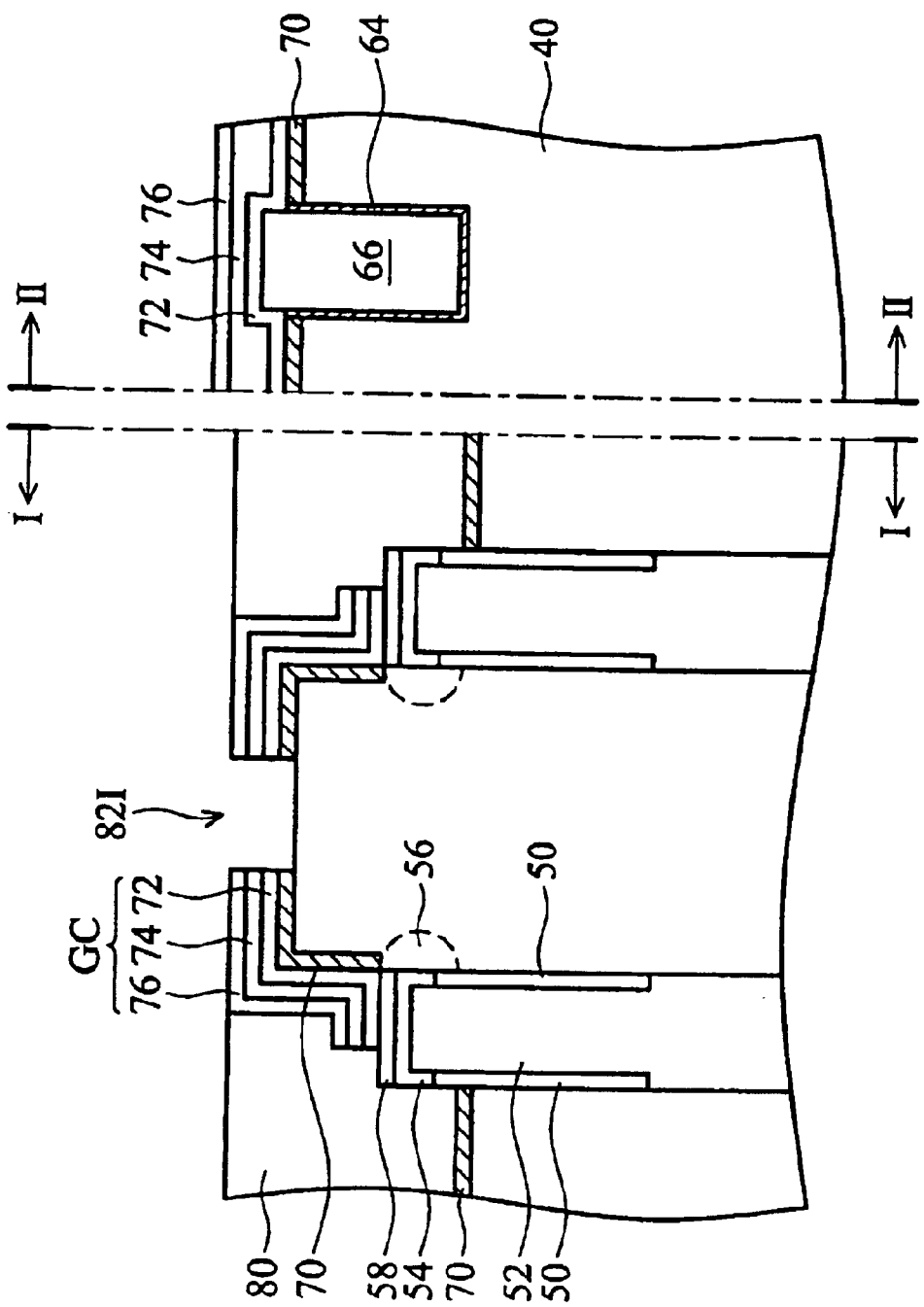

In FIG. 7I, after removing the third photoresist layer 78, a second HDP oxide layer 80 is formed to fill the shallow trench 63 outside the active area AA of the array area I, and then CMP is employed to level off the top surfaces of the second HDP oxide layer 80 and the gate conductive line GC. Next, in FIG. 7J, by performing photolithography and etching on the active area AA of the array area I, a first contact hole 82I is formed to penetrate the gate conductive line GC and the gate oxide layer 70, thus exposing the substrate 40.

Figure 7K:
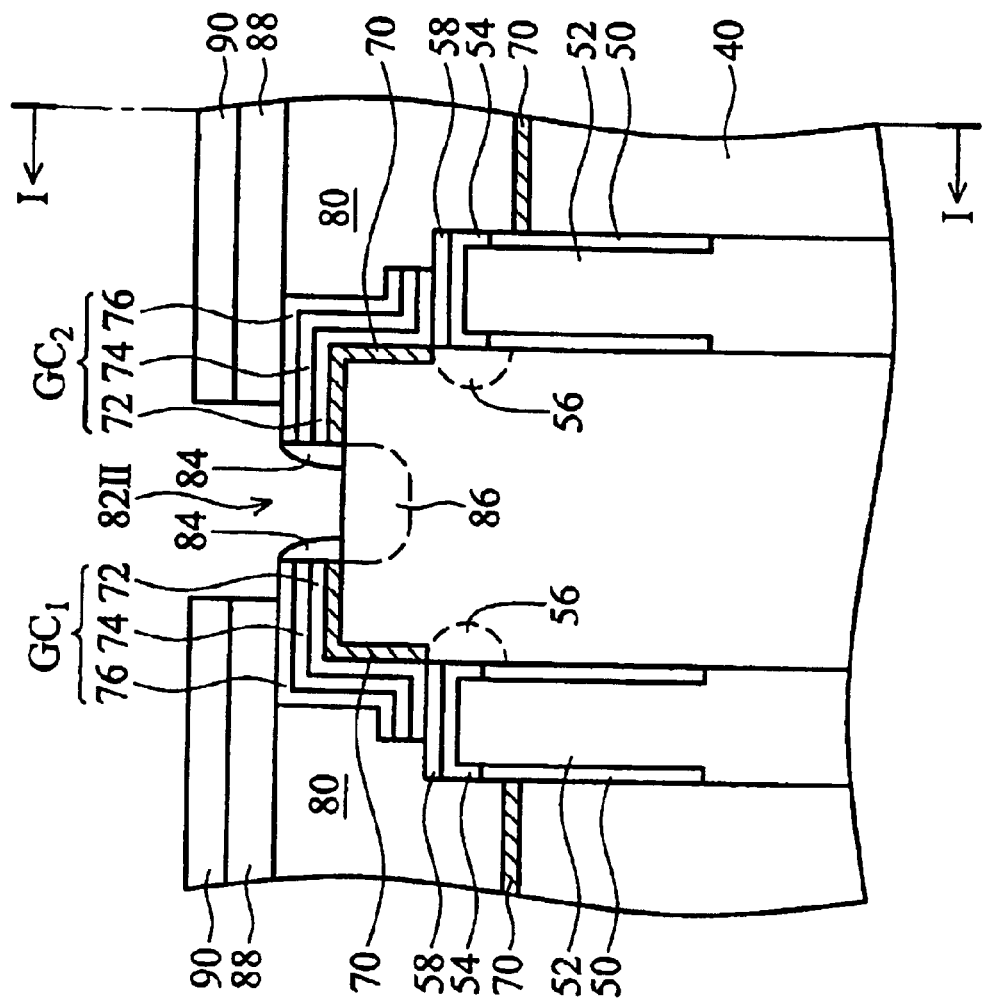
Figure 7L:
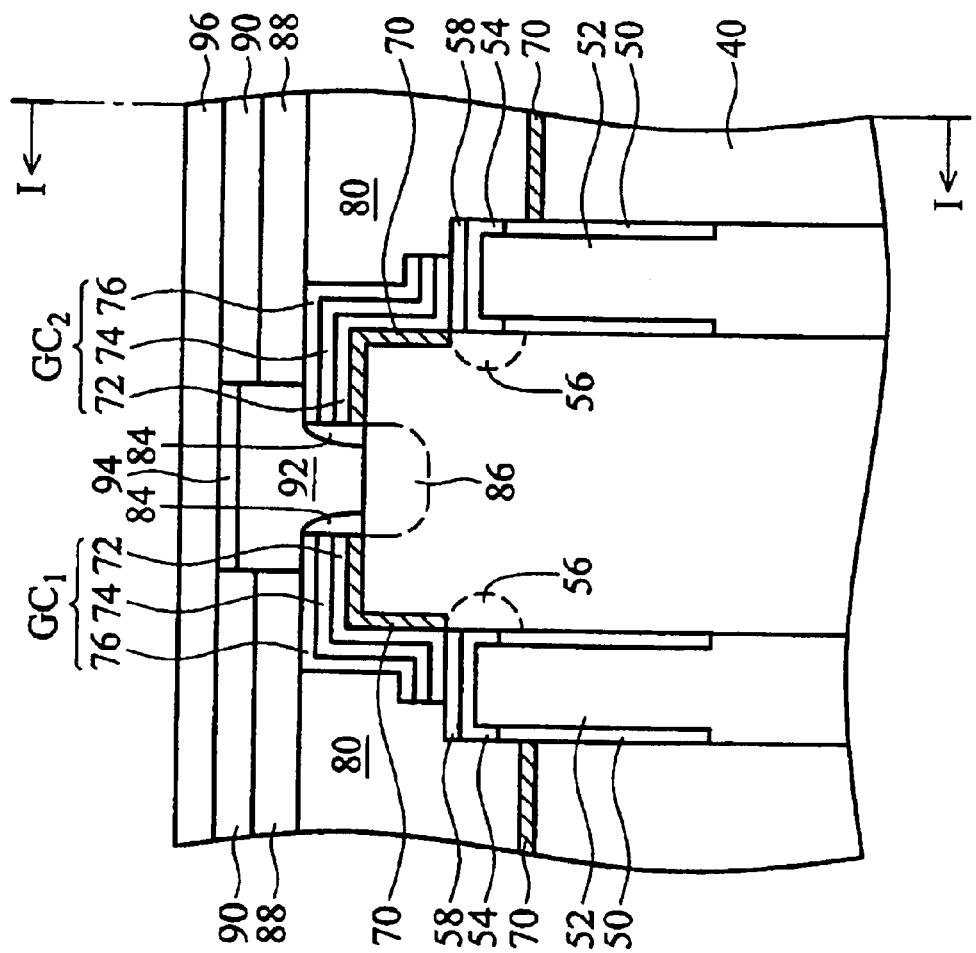

In FIG. 7K, a nitride spacer 84 is formed on the sidewall of the first contact hole 82I, and then an ion implantation process is performed to form a source/drain diffusion region 86 in the semiconductor silicon substrate 40 exposed by the first contact hole 82I. Next, deposition and CMP for a BPSG layer 88 and deposition and annealing for a TEOS oxide layer 90 are successively performed thereon. Next, using photolithography and etching, a second contact hole 82II is formed to expose the first contact hole 82I and the source/drain diffusion region 86. Finally, in FIG. 7L, the second contact hole 82II is filled with a polysilicon contact layer 92, and then a W/TiN/Ti layer 94 is formed on the polysilicon contact layer 92, and then a bitline 96 is patterned thereon.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fabrication method for a dynamic random access memory cell layout, comprising the steps of:

providing a semiconductor silicon substrate having an array area and a support area;

forming a pad layer overlying the semiconductor silicon substrate, in which the pad layer comprises a predetermined deep trench pattern;

forming a first deep trench and a second deep trench in the semiconductor silicon substrate within the array area;

forming a first deep trench capacitor and a second deep trench capacitor at the lower portions of the first deep trench and the second deep trench, respectively;

forming a collar dielectric layer on the sidewalls of the first deep trench and the second deep trench, respectively, in which the collar dielectric layer is disposed over the first deep trench capacitor and the second deep trench capacitor;

forming a polysilicon layer in the first deep trench and the second deep trench, in which the polysilicon layer is surrounded by the collar dielectric layer;

forming a first buried strap out-diffusion region and a second buried strap out-diffusion region in the semiconductor silicon substrate adjacent to the sidewalls of the first deep trench and the second deep trench, respectively, in which the first buried strap out-diffusion region and the second buried strap out-diffusion region are adjacent to the polysilicon layer in the first deep trench and the second deep trench, respectively;

forming a top isolating layer to cover the top of the polysilicon layer in the first deep trench and the second deep trench;

forming two first shallow trenches in the semiconductor silicon substrate within the array area to separate the active area from other areas, in which the first shallow trenches are outside the first deep trench and the second deep trench is within the array area;

forming a second shallow trench in the semiconductor silicon substrate within the support area;

forming a liner on the substrate;

forming a first isolating layer in the first shallow trenches and the second shallow trench, in which the top of the first isolating layer is leveled off with the top of the liner;

forming a photoresist layer to cover the support area;

removing the first isolating layer formed in the first shallow trenches within the array area;

removing the photoresist layer, the exposed liner and the pad layer, in which the semiconductor silicon substrate within the active area of the array area protrude from the top isolating layer;

forming a gate oxide layer on the exposed surface of the semiconductor silicon substrate;

forming a gate conductive structure on the active area between the first deep trench and the second deep trench;

forming a second isolating layer to fill the first shallow trenches, in which the top of the second isolating layer is leveled with the top of the gate conductive structure; and forming a first contact hole penetrating the gate conductive structure and the gate oxide layer to expose the semiconductor silicon substrate.

2. The fabrication method for a dynamic random access memory cell layout as claimed in claim 1, wherein the liner is a silicon nitride layer.

3. The fabrication method for a dynamic random access memory cell layout as claimed in claim 1, wherein the first isolating layer is a HDP (high-density plasma) oxide layer.

4. The fabrication method for a dynamic random access memory cell layout as claimed in claim 1, wherein the gate conductive structure comprises a polysilicon layer, a metallic silicide layer and a nitride cap layer.

5. The fabrication method for a dynamic random access memory cell layout as claimed in claim 1, wherein the second isolating layer is a HDP (high-density plasma) oxide layer.

6. The fabrication method for a dynamic random access memory cell layout as claimed in claim 1, further comprising the steps of:

forming a spacer on the sidewall of the first contact hole;

forming a common source/drain diffusion region in the semiconductor substrate exposed within the first contact hole;

forming a first inter-layered dielectric and a second inter-layered dielectric overlying the semiconductor silicon substrate;

forming a second contact hole which penetrates the second inter-layered dielectric and the first inter-layered dielectric to expose the first contact hole and the common source/drain diffusion region;

forming a contact layer in the second contact hole; and forming a bitline overlying the second inter-layered dielectric, in which the bitline is electrically connected to the contact layer.

7. The fabrication method for a dynamic random access memory cell layout as claimed in claim 6, wherein the spacer is a silicon nitride layer.

8. The fabrication method for a dynamic random access memory cell layout as claimed in claim 6, wherein the first inter-layered dielectric is a BPSG layer.

9. The fabrication method for a dynamic random access memory cell layout as claimed in claim 6, wherein the second inter-layered dielectric is a TEOS oxide layer.

* * * * *